(12) United States Patent
Zhang

(10) Patent No.: US 12,738,550 B2
(45) Date of Patent: Sep. 15, 2026

(54) BASE, VOLTAGE SAMPLING ASSEMBLY, AND VOLTAGE TESTING APPARATUS

(71) Applicant: CONTEMPORARY AMPEREX TECHNOLOGY (HONG KONG) LIMITED, Hong Kong (CN)

(72) Inventor: Rongji Zhang, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 617 days.

(21) Appl. No.: 18/343,817

(22) Filed: Jun. 29, 2023

(65) Prior Publication Data

US 2023/0344024 A1 Oct. 26, 2023

Related U.S. Application Data

(63) Continuation of application No. PCT/CN2023/084154, filed on Mar. 27, 2023.

(30) Foreign Application Priority Data

Jul. 20, 2022 (CN) ......................... 202221863594.5

(51) Int. Cl.

*H01M 10/48* (2006.01)
*G01R 31/364* (2019.01)
*G01R 31/388* (2019.01)

(52) U.S. Cl.

CPC .......... *H01M 10/48* (2013.01); *G01R 31/364* (2019.01); *G01R 31/388* (2019.01); *H01M 2220/20* (2013.01); *Y02E 60/10* (2013.01)

(58) Field of Classification Search

CPC ... G01R 31/364; G01R 31/388; H01M 10/48; H01M 2220/20; Y02E 60/10

See application file for complete search history.

(56) References Cited

U.S. PATENT DOCUMENTS

| | | | | |
|---|---|---|---|---|
| 4,100,475 | A | 7/1978 | Gansert et al. | |
| 6,168,470 | B1 * | 1/2001 | Ikeda .................. | H01M 10/482 439/627 |
| 2011/0076888 | A1 | 3/2011 | Fernandez et al. | |

FOREIGN PATENT DOCUMENTS

| | | |
|---|---|---|
| CN | 209055581 U | 7/2019 |
| CN | 110247207 A | 9/2019 |
| CN | 112310566 A | 2/2021 |

(Continued)

OTHER PUBLICATIONS

International Search Report for International Application No. PCT/CN2023/084154, dated Jul. 14, 2023.

(Continued)

*Primary Examiner* — Lingwen R Zeng

(74) *Attorney, Agent, or Firm* — Ladas & Parry LLP

(57) ABSTRACT

Embodiments of this application provide a base, a voltage sampling assembly, and a voltage testing apparatus, and pertain to the field of battery production technologies. The base includes a body and a pair of clamping members. The body is provided with a through hole for the voltage sampling member to run through. The pair of clamping members mounted on the body is configured to clamp a busbar connected to a battery cell. The base provided in the embodiments of this application can reduce the production cost of batteries and facilitate the promotion of batteries.

13 Claims, 9 Drawing Sheets

(56) References Cited

FOREIGN PATENT DOCUMENTS

| | | | |
|---|---|---|---|
| CN | 113363682 | A | 9/2021 |
| CN | 216389646 | U | 4/2022 |
| CN | 216850249 | U | 6/2022 |
| CN | 217605934 | U | 10/2022 |
| DE | 102018215784 | A1 | 3/2020 |
| JP | 2013206840 | A | 10/2013 |
| KR | 20180078776 | A | 7/2018 |
| WO | 2018220902 | A1 | 12/2018 |

OTHER PUBLICATIONS

Written Opinion of International Search Authority for International Application No. PCT/CN2023/084154, dated Jul. 14, 2023.
Notice of Grant of Utility Model Patent Rights for CN Application No. 202221863594.5, dated Aug. 4, 2022.
Extended European Search Report for EP application No. 23732800.0, dated Jul. 18, 2024.

* cited by examiner

BASE, VOLTAGE SAMPLING ASSEMBLY, AND VOLTAGE TESTING APPARATUS

CROSS-REFERENCE TO RELATED APPLICATIONS

This application is a continuation of International Patent Application No. PCT/CN2023/084154, filed on Mar. 27, 2023, which claims priority to Chinese Patent Application No. 202221863594.5, filed on Jul. 20, 2022. The aforementioned patent applications are incorporated herein by reference in their entirety.

TECHNICAL FIELD

This application relates to the field of batteries, and specifically to a base, a voltage sampling assembly, and a voltage testing apparatus.

BACKGROUND

Energy conservation and emission reduction are crucial to the sustainable development of the automobile industry. Electric vehicles, with their advantages in energy conservation and emission reduction, have become an important part of sustainable development of the automobile industry. For electric vehicles, battery technology is an important factor in connection with their development.

In the development of battery technology, production cost is another non-negligible issue in addition to performance improvement. If the production cost of batteries cannot be controlled, resulting in low cost performance of the batteries produced, it will be difficult to produce and promote the batteries on a large scale. Therefore, how the production cost of the battery is reduced is a technical problem yet to be solved in battery technology.

SUMMARY

This application provides a base, a voltage sampling assembly, and a voltage testing apparatus, so that parts used in battery testing can be reused, thereby reducing production cost of batteries, improving cost performance of batteries, and promoting the use of batteries.

According to a first aspect, this application provides a base for mounting a voltage sampling member to perform voltage sampling on a battery cell. The base includes a body and a pair of clamping members. The body is provided with a through hole for the voltage sampling member to run through. The pair of clamping members mounted on the body is configured to clamp a busbar connected to the battery cell.

In the technical solution of the embodiments of this application, battery capacity needs to be tested before battery cells are put into use. In a battery capacity testing process, two busbars are respectively connected to the positive and negative electrode terminals of the battery cell, so as to connect the battery cell to the circuit, so that the positive and negative electrode terminals of the battery cell have current flowing therebetween.

The voltage sampling member is connected to the electrode terminal of the battery cell via the through hole on the body and the positioning hole on the busbar, so as to measure the voltage of the battery cell. The voltage sampling member can determine the position of the electrode terminal based on the position of the body. The inner wall of the through hole can support and limit the voltage sampling member, so that the voltage sampling member can be stably disposed in the through hole, thus enhancing the connection stability between the voltage sampling member and the electrode terminal.

The pair of clamping members mounted on the body can clamp the busbar, so that the body can be fastened to the busbar, thereby ensuring the stable connection between the voltage sampling member and the electrode terminal.

After the testing and sampling are completed, the clamping members can release the busbar, and then the base can be moved to the busbar connected to another battery cell that needs to be tested. The clamping members can clamp the new busbar, so that the voltage sampling member can test the new battery cell.

The base can be reused in the testing process of multiple battery cells through the repeated clamping and releasing. This can reduce the number of bases required for positioning the voltage sampling member in the testing process, avoid waste of materials, reduce the production cost of battery cells, improve the cost performance of batteries, and facilitate the promotion of batteries.

In some embodiments, the pair of clamping members are provided on two opposite sides of the body in a first direction, the first direction being perpendicular to an axial direction of the through hole.

In the technical solution of the embodiments of this application, the pair of clamping members can be disposed on two opposite sides of the body. When the pair of clamping members fits with the busbar, in order to clamp the busbar, a direction of the force from the clamping members on the busbar always passes through the axis of the positioning hole, so that the direction of the reaction force from the clamping members on the base can always pass through the axis of the through hole, and the body can maintain force balance on the busbar, to ensure relative fixation of the body and the busbar.

In some embodiments, of the pair of clamping members, one clamping member is rotatably mounted to the body around a first axis, and the other one is rotatably mounted to the body around a second axis, the first axis and the second axis being parallel.

In the technical solution of the embodiments of this application, the pair of clamping members can be rotatably mounted on the body. When the pair of clamping members gets close to the busbar by rotation, the first axis a is parallel to the second axis b. When the clamping members clamp the busbar, the directions of the forces from the pair of clamping members on the busbar can be parallel, and the forces from the pair of clamping members on the busbar can be mutually offset, thus ensuring that the clamping members can stably clamp the busbar.

In some embodiments, the first axis and the second axis extend in a second direction, and the second direction is perpendicular to the first direction and is perpendicular to the axial direction of the through hole.

In the technical solution of the embodiments of this application, a flipping range of the clamping member can be limited to the plane in which the first direction and the axial direction of the through hole lie, and the forces from the pair of clamping members on the busbar can be steadily offset each other, allowing the busbar to maintain force balance.

In some embodiments, the base further includes elastic members, connecting the body and the clamping members for providing clamping force.

In the technical solution of the embodiments of this application, the elastic member is connected between the body and the clamping member, and uses its own elasticity to pull the clamping member to close to the busbar. The elasticity of the elastic member can also provide clamping force for the clamping member to clamp the busbar, so that the base can be fastened to the busbar.

In some embodiments, the body has a first surface and a second surface opposite each other in the axial direction of the through hole, and the clamping member includes a clamping end for clamping the busbar and an operating end for manual operation, where the clamping end protrudes from the first surface.

In the technical solution of the embodiments of this application, the clamping end of the clamping member exceeds the first surface, and the clamping end is close to the busbar, so that the busbar is clamped between the clamping ends of the pair of clamping members and the first surface, and the base gets close to and is fastened to the busbar from three directions.

In some embodiments, the clamping end is provided with a snap hook portion for snap hooking on an edge of the busbar.

In the technical solution of the embodiments of this application, when the clamping member clamps the busbar, the snap hook portion can hold the surface of the busbar back away from the first surface, the busbar is clamped between the clamping ends of the pair of clamping members, the first surface, and the snap hook portion, and the base gets close to and is fastened to the busbar from four directions, thereby improving the connection stability between the base and the busbar.

In some embodiments, the clamping end is provided with at least two snap hook portions, where the at least two snap hook portions are spaced apart in a second direction, the first direction is perpendicular to the axial direction of the through hole, and the second direction is perpendicular to the first direction and perpendicular to the axial direction of the through hole.

In the technical solution of the embodiments of this application, the busbar is connected to the electrode terminal, and a gap is present between adjacent snap hook portions to avoid the electrode terminal, thereby protecting the electrode terminal from interference of the snap hook portions.

In some embodiments, the operating end protrudes from the second surface.

In the technical solution of the embodiments of this application, the operating end of the clamping member protrudes from the second surface, so that a user can grasp, push, and pull the clamping member without interfering with the body, simplifying the mounting, unmounting, and movement of the base and making it easier to use.

In some embodiments, a limiting protrusion is formed around the through hole on the first surface, and the limiting protrusion is configured to be inserted into the positioning hole of the busbar.

In the technical solution of the embodiments of this application, the limiting protrusion fits into the positioning hole of the busbar, so that the through hole can be coaxially disposed with the positioning hole of the busbar, and the voltage sampling member can accurately pass through the positioning hole to connect to the electrode terminal by passing through the through hole. This can reduce the time for positioning the electrode terminal in the process of connecting the voltage sampling member to the electrode terminal, thereby improving the testing efficiency of the battery cell.

In some embodiments, the body and the clamping members are made of an insulating material.

In the technical solution of the embodiments of this application, the body and the clamping members are all made of the insulating material, so as to prevent contact between different bases that may lead to short circuit by overlap of positive and negative electrode terminals of the battery cell.

According to a second aspect, a voltage sampling assembly is provided, including the base according to the first aspect and a voltage sampling member, where the voltage sampling member is threaded through the through hole.

In some embodiments, the through hole is provided with internal threads on an inner wall, and the voltage sampling member is provided with external threads matching the internal threads.

In the technical solution of the embodiments of this application, the voltage sampling member runs through the through hole and is fastened in the through hole by threading its external threads with the internal threads of the through hole, the body is fastened to the busbar via the clamping member, and the through hole faces the electrode terminal. This improves the connection stability between the voltage sampling member and the electrode terminal.

According to a third aspect, a voltage testing apparatus is provided, including a processing module and two voltage sampling assemblies according to the second aspect, where voltage sampling members of the two voltage sampling assemblies are all electrically connected to the processing module.

In the technical solution of the embodiments of this application, during the testing of the battery cell, the electrode terminal of the battery cell is connected to the charge/discharge machine via the busbar. The current output from the battery cell is transmitted to the charge/discharge machine only through the busbar, and the charge/discharge machine controls the current flowing through the busbar to be a stable constant current.

The voltage sampling assembly is connected to the positive and negative terminals of the battery cell via the voltage sampling member to collect the output voltage of the battery cell, and can record the operation duration of the battery. The voltage, operation duration of the battery cell, and internal resistance of the charge/discharge machine collected by the voltage sampling assembly are transmitted to the processing module. The processing module processes the data to calculate the battery capacity of the battery cell and obtain the test results of the battery cell, so as to determine whether the battery cell is qualified.

Additional aspects and advantages of this application will be given in part in the following description, part of which will become apparent from the following description or be learned from the practice of this application.

BRIEF DESCRIPTION OF DRAWINGS

To describe the technical solutions of the embodiments of this application more clearly, the following briefly describes the accompanying drawings required for describing the embodiments. It is appreciated that the accompanying drawings below show merely some embodiments of this application and thus should not be considered as limitations on the scope. Persons of ordinary skill in the art may still derive other related drawings from the accompanying drawings without creative efforts.

Figure 1:
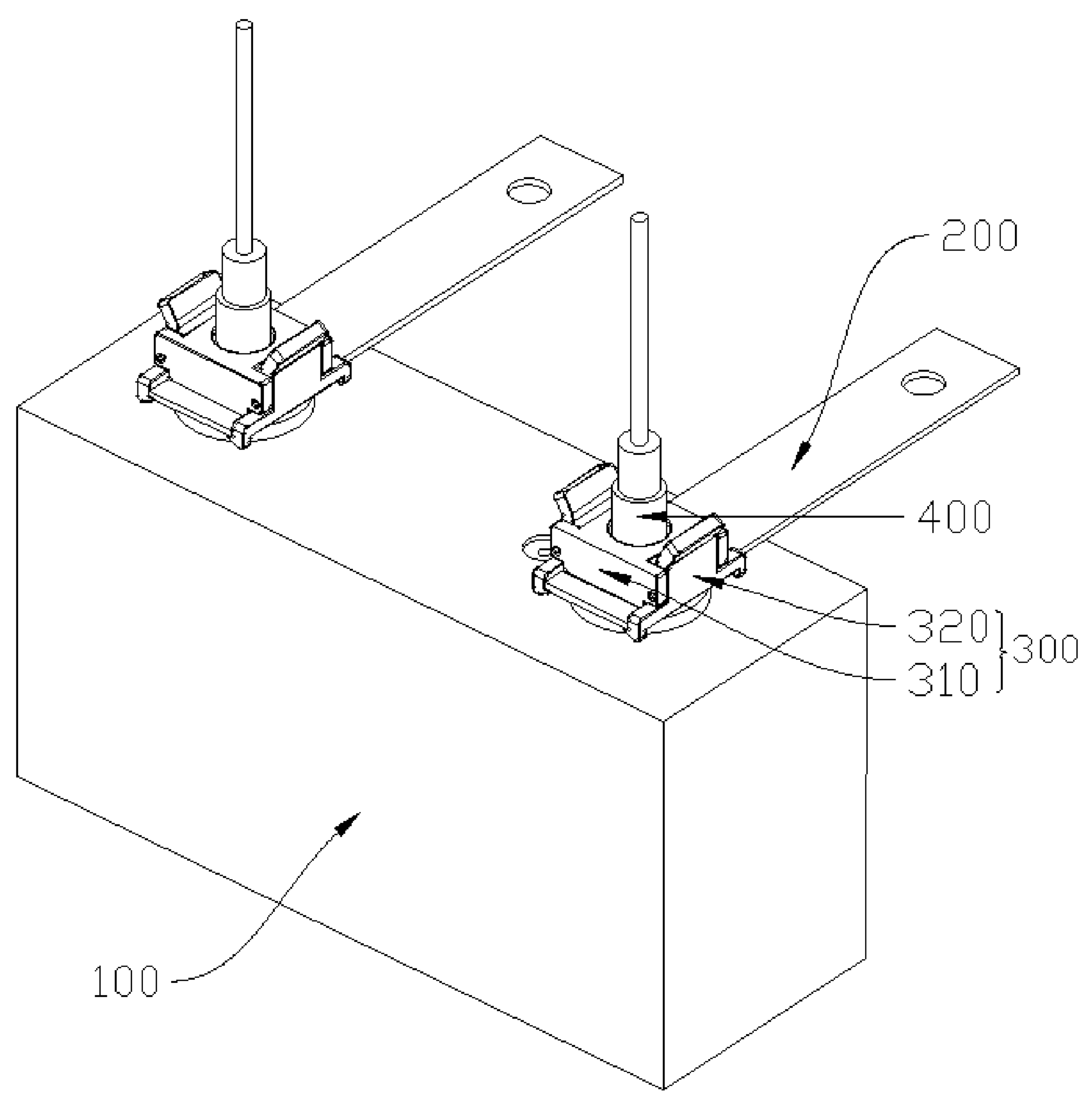
FIG. 1 is a schematic diagram of a connection structure of a battery cell for testing according to some embodiments of this application.

The accompanying drawings are not drawn to scale.

REFERENCE SIGNS

100. battery cell;
110. electrode terminal;
200. busbar;
201. positioning hole;
300. base;
310. body;
311. through hole;
312. first surface;
313. second surface;
320. clamping member;
321. clamping end;
322. operating end;
323. snap hook portion;
330. elastic member;
340. fastening pin;
350. limiting protrusion;
400. voltage sampling member;
a. first axis;
b. second axis;
X. first direction; and
Y second direction.

DETAILED DESCRIPTION

To make the objectives, technical solutions, and advantages of the embodiments of this application clearer, the following clearly and completely describes the technical solutions in the embodiments of this application with reference to the accompanying drawings in the embodiments of this application. Apparently, the described embodiments are some but not all embodiments of this application. All other embodiments obtained by persons of ordinary skill in the art based on the embodiments of this application without creative efforts shall fall within the protection scope of this application.

Unless otherwise defined, all technical and scientific terms used in this application shall have the same meanings as commonly understood by those skilled in the art to which this application relates. The terms used in the specification of this application are intended to merely describe the specific embodiments rather than to limit this application. The terms "include", "comprise", and any variations thereof in the specification and claims of this application as well as the foregoing description of drawings are intended to cover non-exclusive inclusions. In the specification, claims, or accompanying drawings of this application, the terms "first", "second", and the like are intended to distinguish between different objects rather than to indicate a particular order or relative importance.

Reference to "embodiment" in this application means that specific features, structures, or characteristics described with reference to the embodiment may be included in at least one embodiment of this application. The word "embodiment" appearing in various places in the specification does not necessarily refer to the same embodiment or an independent or alternative embodiment that is exclusive of other embodiments. It is explicitly or implicitly understood by persons skilled in the art that the embodiments described herein may be combined with other embodiments.

In the description of this application, it should be noted that unless otherwise specified and defined explicitly, the terms "mount", "connect", "join", and "attach" should be understood in their general senses. For example, they may refer to a fixed connection, a detachable connection, or an integral connection, and may refer to a direct connection, an indirect connection via an intermediate medium, or an internal communication between two elements. A person of ordinary skills in the art can understand specific meanings of these terms in this application as appropriate to specific situations.

The term "and/or" in this application is only an associative relationship for describing associated objects, indicating that three relationships may be present. For example, A and/or B may indicate three cases: presence of only A; presence of both A and B; and presence of only B. In addition, the character "/" in this application generally indicates an "or" relationship between contextually associated objects.

In this application, "a plurality of" means more than two (inclusive). Similarly, "a plurality of groups" means more than two (inclusive) groups, and "a plurality of pieces" means more than two (inclusive) pieces.

In this application, the battery cell may include a lithium-ion secondary battery, a lithium-ion primary battery, a lithium-sulfur battery, a sodium-lithium-ion battery, a sodium-ion battery, a magnesium-ion battery, or the like. This is not limited in the embodiments of this application. The battery cell may be cylindrical, flat, cuboid, or of other shapes, which is not limited in the embodiments of this application either. Battery cells are typically divided into three types by packaging method: cylindrical cell, prismatic cell, and pouch cell. The type of battery is not limited in the embodiments of this application either. The battery cell includes two electrode terminals: one is a positive electrode terminal and the other is a negative electrode terminal. The current flows out of the battery cell through the positive electrode terminal and flows into the battery cell through the negative electrode terminal.

In this application, after production of the battery cells is completed, samples need to be taken for battery capacity testing to filter out inferior products that do not meet the rated standard. The busbar is a component configured for implementing electrical connection between multiple battery cells. The busbar can implement the electrical connection between the battery cells by connecting the electrode terminals of the battery cells. In the battery capacity testing process, the positive electrode terminal and negative electronic terminal of a sample battery cell are electrically connected to the charge/discharge machine through the busbar for discharging, and the voltage testing apparatus measures battery capacity of the battery cell.

The voltage testing apparatus includes a processing module and a voltage sampling assembly. The voltage testing apparatus mainly uses the processing module to process data obtained by the voltage sampling assembly. The voltage sampling assembly includes a voltage sampling member and a base. The busbar is provided with a positioning hole to expose the positive electrode terminal or the negative electrode terminal, and the base is provided in the busbar to facilitate connection of the voltage sampling member to the positive electrode terminal or the negative electrode terminal. The two voltage sampling members are respectively connected to the positive electrode terminal and the negative electrode terminal via the positioning hole to obtain the voltage between the positive and negative electrodes of the battery cell and the operation duration of the battery cell.

Currently, from a perspective of the market development, application of traction batteries is becoming more extensive. Traction batteries have been not only used in energy storage power supply systems such as hydroelectric power plants, thermal power plants, wind power plants, and solar power plants, but also widely used in many other fields including electric transportation tools such as electric bicycles, electric motorcycles, and electric vehicles, military equipment, and aerospace. With continuous expansion of application fields of traction batteries, market demands for the traction batteries are also expanding.

Before a batch of battery cells is put into use, one or more samples are taken for battery capacity test, and the results of the test are used to determine whether the batch of battery cells meet the rated battery capacity, so as to filter out or scrap battery cells that do not meet the rated battery capacity.

It is noted that in the battery capacity testing process, the voltage sampling member requires the base to ensure its stable connection with the electrode terminals of the battery cell, and the base is fastened to the busbar that is fixedly connected to the electrode terminals. After the battery capacity testing of the battery cell is completed, the used base is discarded, and the voltage sampling member uses a new base to connect the electrode terminals of the new battery cell for sampling. Frequent replacement of bases has an adverse effect on the promotion of battery cells. For example, the busbar is fastened to the electrode terminal of the sample battery cell, and the base is fastened to the busbar by welding (or one-piece molding, or the like). After the battery capacity testing is completed, the base is scrapped together with the busbar and the sample battery cell. The frequent scrap and replacement of bases leads to increased battery production cost.

In order to solve the disadvantage of high battery production cost, the applicants have found that the number of parts that are scrapped after use for battery capacity testing of the battery cells can be reduced. Specifically, a manner for connecting the base and the busbar is changed so that the base can be unmounted from the busbar without damage, making it possible to be recycled.

In view of the foregoing considerations, in order to solve the problem of high cost and low cost performance of battery cells caused by frequent replacement of bases, a base has been designed through in-depth research. The body of the base is assembled with the clamping member and the clamping member clamps the busbar, so that the body can be fastened to the busbar. In the voltage testing apparatus including such base, the clamping member is used to clamp the busbar so that the body of the base is fastened to the busbar, and the voltage sampling member passes through the through hole provided on the body and is stably connected to the electrode terminal of the battery cell with the support from the hole wall of the through hole. After the battery capacity testing is completed, the clamping member can release the busbar to let the base separate from the busbar, and then re-clamp another busbar in the subsequent battery capacity testing process to fasten the body of the base to the battery cell, so that the base can be recycled. This can reduce the number of scrapped bases in the battery capacity testing process, reduce the production cost of batteries, and facilitate the promotion of battery cells.

The base disclosed in embodiment of this application can be used in the battery capacity testing process, but is not limited thereto. The base can also be applied to all battery cell production systems having the base, voltage sampling assembly, and voltage testing apparatus disclosed in this application. In this way, the number of bases scrapped for battery testing can be reduced, thereby reducing the production cost of batteries and facilitating the promotion of batteries.

According to some embodiments of this application, as shown in FIG. 1 to FIG. 7, this application provides a base 300, configured for mounting a voltage sampling member 400 for voltage sampling of a battery cell 100. The base 300 includes a body 310 and a pair of clamping members 320. The body 310 is provided with a through hole 311 for the voltage sampling member 400 to run through. The pair of clamping members 320 mounted on the body 310 is configured to clamp a busbar 200 connected to a battery cell 100.

Battery capacity needs to be tested before the battery cells are put into use. In the battery capacity testing process, two busbars 200 are respectively connected to the positive and negative electrode terminals of the battery cell 100, so as to connect the battery cell 100 to the circuit, so that the positive and negative electrode terminals of the battery cell 100 have current flowing therebetween.

The through hole 311 faces a positioning hole 201 on the busbar 200, and the voltage sampling member 400 is connected to the electrode terminal 110 of the battery cell 100 via the through hole 311 on the body 310 and the positioning hole 201 on the busbar 200, so as to measure the voltage of the battery cell. The voltage sampling member 400 can determine the position of the electrode terminal 110 based on the position of the body 310. The inner wall of the through hole 311 can support and limit the voltage sampling member 400, so that the voltage sampling member 400 can be stably disposed in the through hole 311, thus enhancing the connection stability between the voltage sampling member 400 and the electrode terminal 110.

The voltage sampling member 400 can slidably fit with the inner wall of the through hole 311, so that the through hole 311 has some limiting function for the voltage sampling member 400 and the voltage sampling member 400 can pass through the through hole 311 and the positioning hole 201 to be electrically connected to the electrode terminal 110.

The pair of clamping members 320 mounted on the body 310 can clamp the busbar 200, so that the body 310 can be fastened to the busbar 200, thereby ensuring stable connection between the voltage sampling member 400 and the electrode terminal 110.

After the sample testing is completed, the clamping members 320 can release the busbar 200, and then the base 300 can be detached from the busbar 200 connected to the tested battery cell 100, and then moved to the busbar 200 connected to another battery cell 100 that needs to be tested. The clamping members 320 can clamp the new busbar 200, so that the base 300 is fastened to the new busbar 200, allowing the voltage sampling member 400 to pass through the through hole 311 to test the new battery cell 100.

The base 300 can be reused in the testing process of multiple sample battery cells 100 through the characteristic of detachably mounting of the clamping member 320 to the busbar 200. This can reduce the number of bases 300 required for positioning the voltage sampling member 400 in the testing process, avoid waste of materials, reduce the production cost of the battery cells 100, improve the cost performance of batteries, and facilitate the promotion of batteries.

The clamping member 320 can be connected to the body 310 via a bolt. Through rotation of the bolt, the clamping member 320 is controlled to clamp the busbar 200. Alternatively, the clamping members 320 can be movably disposed on the body 310, and the clamping members 320 are connected to each other via a screw. Through rotation of the screw, distance between a pair of clamping members 320 is controlled so as to clamp the busbar 200.

Figure 5:
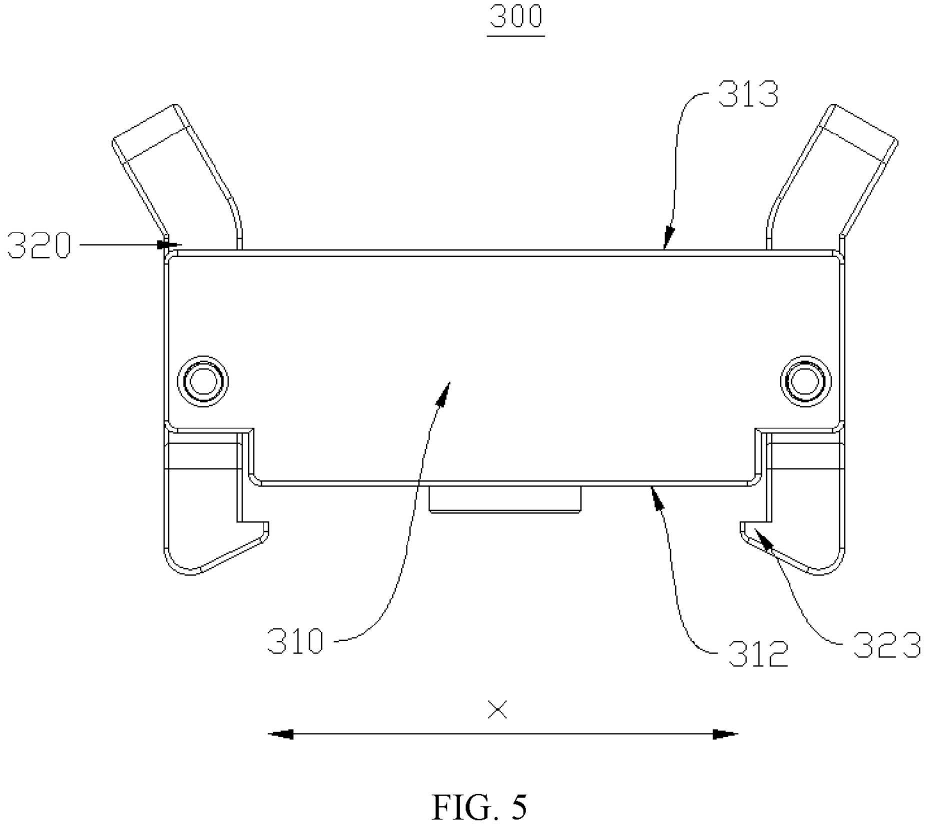
FIG. 5 is a front view of a base according to some embodiments of this application.

According to some embodiments of this application, optionally, as shown in FIG. 5, a pair of clamping members 320 is provided on two opposite sides of the body 310 along a first direction X, the first direction X being perpendicular to an axial direction of the through hole 311.

The pair of clamping members 320 can be disposed on two opposite sides of the body 310. When the pair of clamping members 320 is attached to the busbar 200, in order to clamp the busbar 200, the direction of the force from the clamping members 320 on the busbar 200 always passes through the axis of the positioning hole 201, so that the direction of the reaction force from the clamping members 320 on the base 300 can always pass through the axis of the through hole 311, and the body 310 can maintain force balance on the busbar 200, to ensure relative fixation of the body 310 and the busbar 200.

Figure 6:
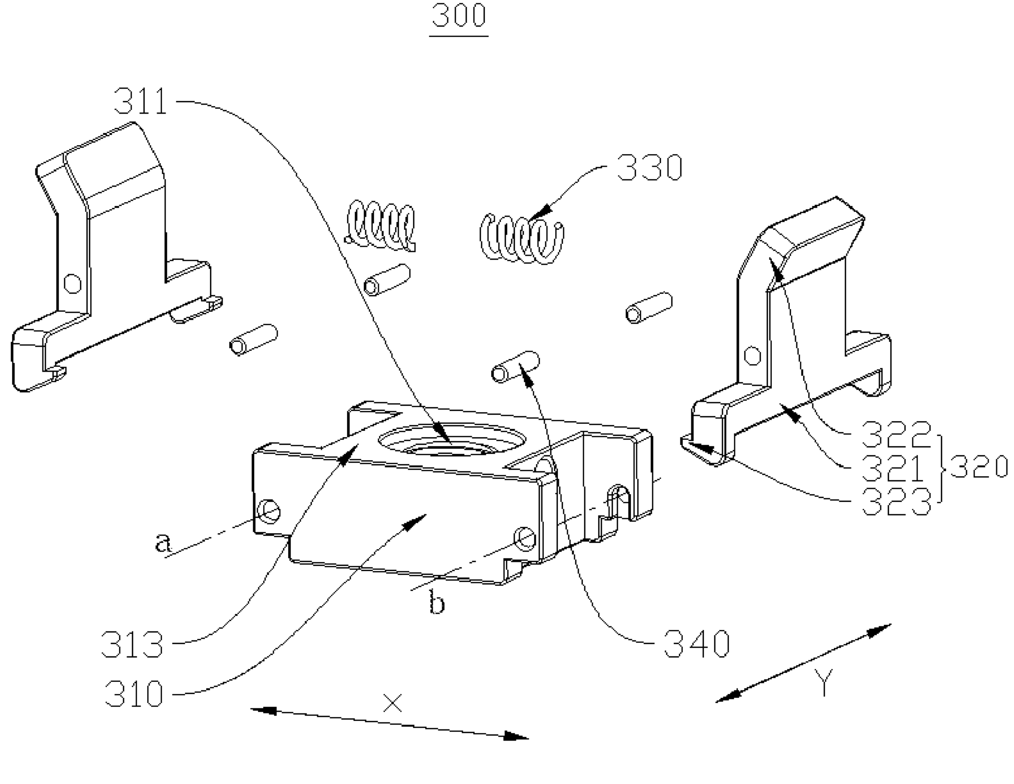
FIG. 6 is an exploded view of a base according to some embodiments of this application.

According to some embodiments of this application, optionally, as shown in FIG. 6, one clamping member in the pair of clamping members 320 is rotatably mounted to the body 310 around a first axis a, and the other is rotatably mounted to the body 310 around a second axis b, the first axis a and the second axis b being parallel.

The first axis a and the second axis b are the center lines around which the pair of clamping members 320 rotate.

The pair of clamping members 320 can be rotatably mounted on the body 310. When the pair of clamping members 320 rotate to get close to the busbar 200, the first axis a is parallel to the second axis b. When the clamping members 320 clamp the busbar 200, the directions of the forces of the pair of clamping members 320 on the busbar 200 can be parallel, and the forces from the pair of clamping members 320 on the busbar 200 can be mutually offset, thus ensuring that the clamping members 320 can stably clamp the busbar 200.

The clamping member 320 can be rotatably disposed on the body 310 via a fastening pin 340 (or a rotating shaft, a bearing, or the like), and the pair of clamping members 320 synchronously gets close to the busbar 200 by rotation to clamp the busbar 200.

According to some embodiments of this application, optionally, still referring to FIG. 6, the first axis a and the second axis b extend along a second direction Y, where the second direction Y is perpendicular to the first direction X and perpendicular to the axial direction of the through hole 311.

A flipping range of the clamping member 320 can be limited to the plane in which the first direction X and the axial direction of the through hole 311 lie, and the forces of the pair of clamping members 320 on the busbar 200 can steadily offset each other, so that the busbar 200 can maintain force balance.

Figure 7:
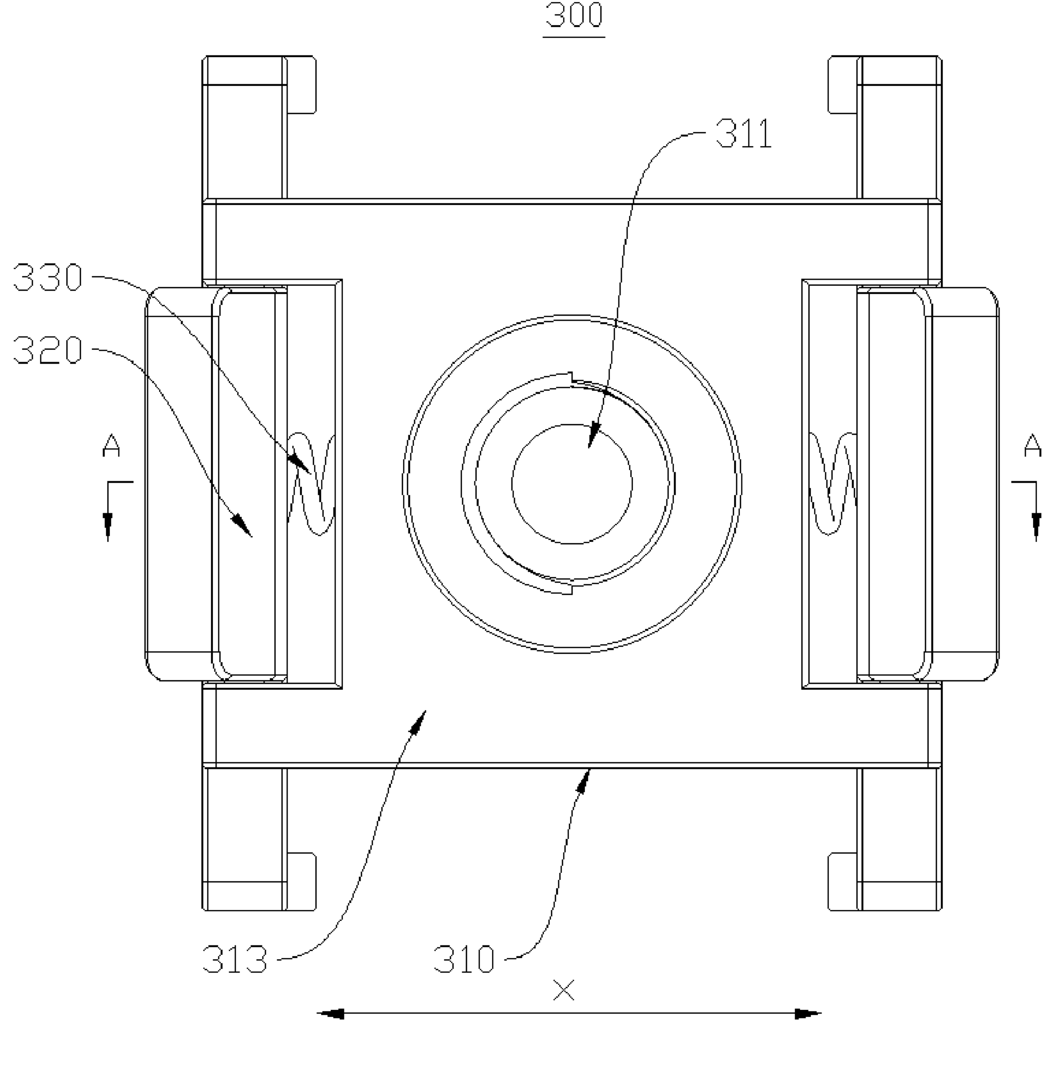
FIG. 7 is a vertical view of a base according to some embodiments of this application.
Figure 9:
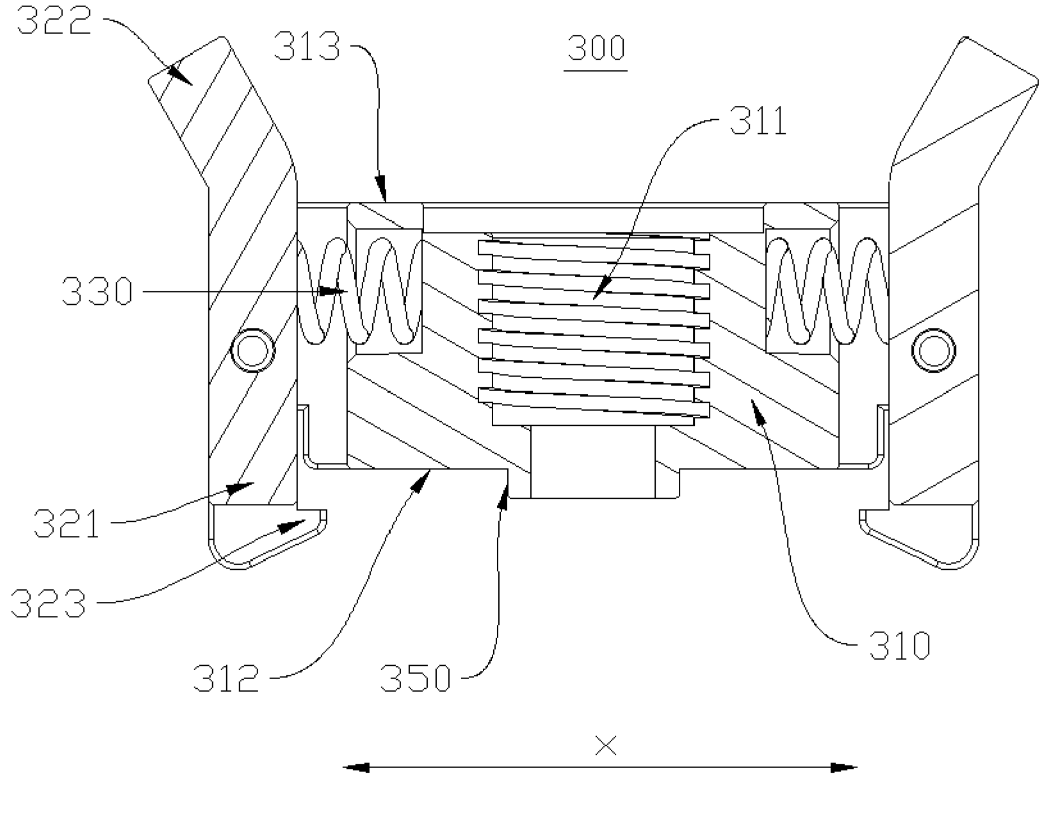
FIG. 9 is a sectional view of FIG. 7 along A-A.

According to some embodiments of this application, optionally, as shown in FIG. 7 and FIG. 9, the base 300 further includes an elastic member 330, where the elastic member 330 connects the body 310 and the clamping member 320, and the elastic member 330 is configured to provide clamping force.

The elastic member 330 is a member having an elastic effect. For example, the elastic member may be a spring, or the material of the elastic member 330 may be but is not limited to resin, silicone, engineering plastic, or the like.

The elastic member 330 is connected between the body 310 and the clamping member 320, and the elastic member 330 is kept in a compressed state and continuously uses its own elasticity to pull or push the clamping member 320 close to the busbar 200. The elasticity of the elastic member 330 can provide clamping force for the clamping member 320 to clamp the busbar 200, so that the base 300 can be fastened to the busbar 200.

The elastic member 330 can adjust its length based on the reaction force from the busbar 200 on the clamping member 320, and the force of the clamping member 320 on the busbar 200 changes accordingly to prevent the busbar 200 from being crushed and broken.

According to some embodiments of this application, optionally, as shown in FIG. 7 to FIG. 10, the body 310 has a first surface 312 and a second surface 313 opposite each other in the axial direction of the through hole 311, and the clamping member 320 includes a clamping end 321 for clamping the busbar 200 and an operating end 322 for manual operation, where the clamping end 321 protrudes from the first surface 312.

The first surface 312 is a surface of the body 310 close to the busbar 200, and the second surface 313 is a surface of the body 310 back away from the busbar 200.

The clamping end 321 of the clamping member 320 protrudes from the first surface 312, the clamping end 321 is close to the busbar 200, and the busbar 200 is clamped between the clamping ends 321 of the pair of clamping members 320 and the first surface 312. The base 300 gets close to the busbar 200 from three directions, so as to enlarge the contact surface between the base 300 and the busbar 200 and improve the connection stability between the base 300 and the busbar 200.

Figure 10:
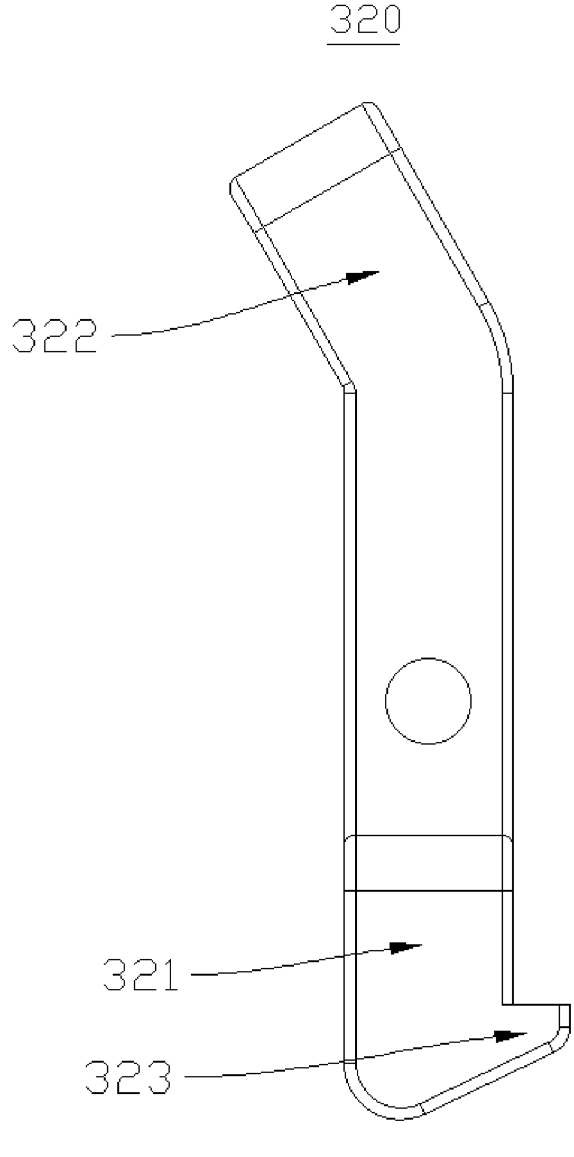
FIG. 10 is a schematic structural diagram of a clamping member according to some embodiments of this application.

According to some embodiments of this application, optionally, as shown in FIG. 9 and FIG. 10, the clamping end 321 is provided with a snap hook portion 323 for snap hooking on an edge of the busbar 200.

The snap hook portion 323 is a convex portion that protrudes from the clamping end 321 and that can hold the surface of the busbar 200 close to the electrode terminal 110.

When the clamping member 320 clamps the busbar 200, the snap hook portion 323 can hold the surface of the busbar 200 back away from the first surface 312. The busbar 200 is clamped between the clamping ends 321 of the pair of clamping members 320, the first surface 312, and the snap hook portion 323. The base 300 gets close to and fastens itself to the busbar 200 from four directions, which further increases the contact area between the base 300 and the busbar 200 and improves the connection stability between the base 300 and the busbar 200.

Figure 8:
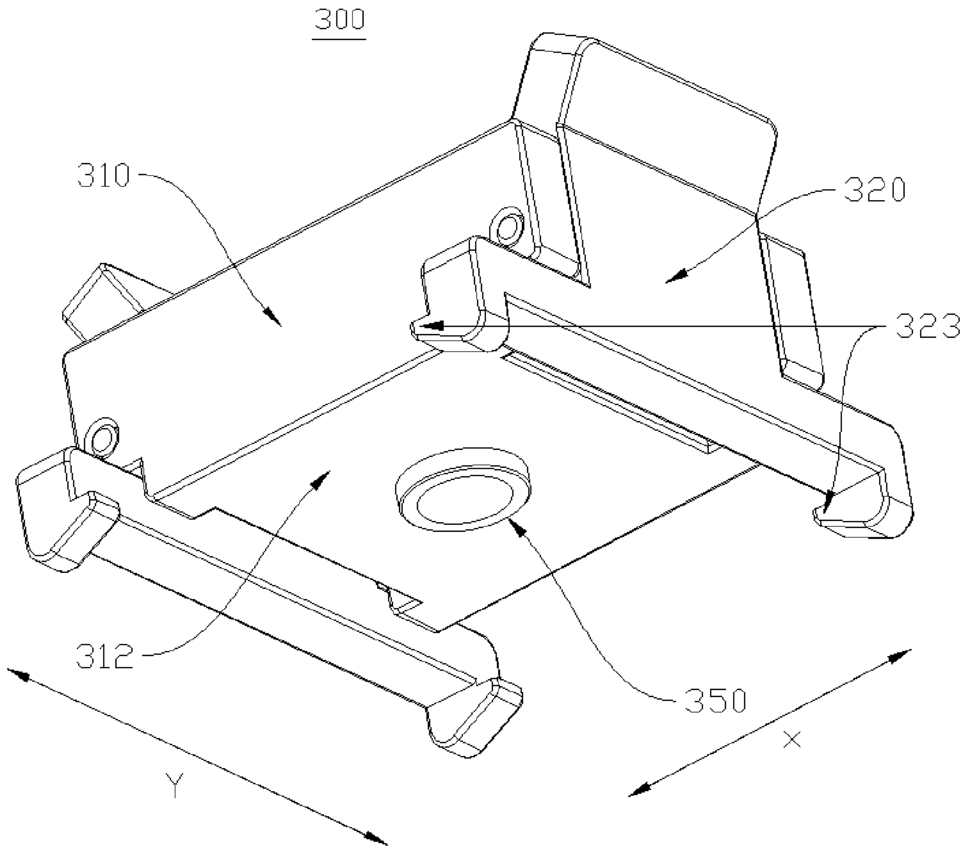
FIG. 8 is a schematic diagram of a structure of a base according to some embodiments of this application.

According to some embodiments of this application, optionally, as shown in FIG. 6 and FIG. 8, the clamping end 321 is provided with at least two snap hook portions 323, and the at least two snap hook portions 323 are spaced apart in a second direction Y, where the second direction Y is perpendicular to the first direction X and perpendicular to the axial direction of the through hole 311.

A gap is present between adjacent snap hook portions 323, so as to avoid the electrode terminal 110, thereby protecting the electrode terminal 110 from interference of the snap hook portions 323.

The gap between adjacent snap hook portions 323 may be greater than or equal to a diameter of the electrode terminal 110. Alternatively, when there is a gap between an outer peripheral surface of the electrode terminal 110 and an edge of the busbar 200 in the first direction, the gap between the adjacent snap hook portions 323 may be smaller than the diameter of the electrode terminal 110, so that the snap hook portions 323 avoid the electrode terminal 110.

According to some embodiments of this application, optionally, as shown in FIG. 9, the operating end 322 protrudes from the second surface 313.

The operating end 322 of the clamping member 320 protrudes from the second surface 313, so that a user can grasp, push, and pull the clamping member 320 without interfering with the body 310, simplifying the mounting, unmounting, and movement processes of the base 300 and making it easier to use.

For example, the operating end 322 of the clamping member 320 can be folded in a direction facing away from the body 310 to form a bent edge, so that the user can grasp the bent edge to push the clamping member 320 to rotate, making it easier to use the base 300.

According to some embodiments of this application, optionally, as shown in FIG. 8 and FIG. 9, a limiting protrusion 350 is formed around the through hole 311 on the first surface 312, and the limiting protrusion 350 is configured to be inserted into the positioning hole 201 of the busbar 200.

The limiting protrusion 350 is a circular protrusion structure coaxially disposed with the through hole 311.

The limiting protrusion 350 fits into the positioning hole 201 of the busbar 200, so that the through hole 311 can be coaxially disposed with the positioning hole 201 of the busbar 200, and the voltage sampling member 400 can accurately pass through the positioning hole 201 to connect to the electrode terminal 110 by passing through the through hole 311. This can reduce the time for positioning the electrode terminal 110 in the process of connecting the voltage sampling member 400 to the electrode terminal 110, thereby improving the testing efficiency of the battery cell 100.

Further, the outer peripheral surface of the limiting protrusion 350 can be attached to the wall of the hole of the positioning hole 201, so that the positioning hole 201 can limit the limiting protrusion 350, thereby enhancing the positioning effect between the body 310 and the busbar 200.

According to some embodiments of this application, optionally, both the body 310 and the clamping member 320 are made of an insulating material.

The insulating material is a material that does not conduct electricity at an allowable voltage. The material of the body 310 and the clamping member 320 may be but is not limited to ceramic, PEEK material (polyether ether ketone), PU material (polyurethane), PAEK material (polyaryl ether ketone), and the like.

The body 310 and the clamping member 320 may be made of an insulating material, so as to prevent contact between different bases 300 from causing short circuit due to overlap of positive and negative electrodes of the battery cell 100.

Further, both the body 310 and the clamping member 320 are made of high temperature resistant material.

Currents flow through the busbar 200, causing the surface temperature of the busbar 200 to rise. The body 310 and the clamping member 320 can be made of high temperature resistant material to prevent the body 310 and the clamping member 320 from being damaged due to high temperature of the busbar 200.

Figure 2:
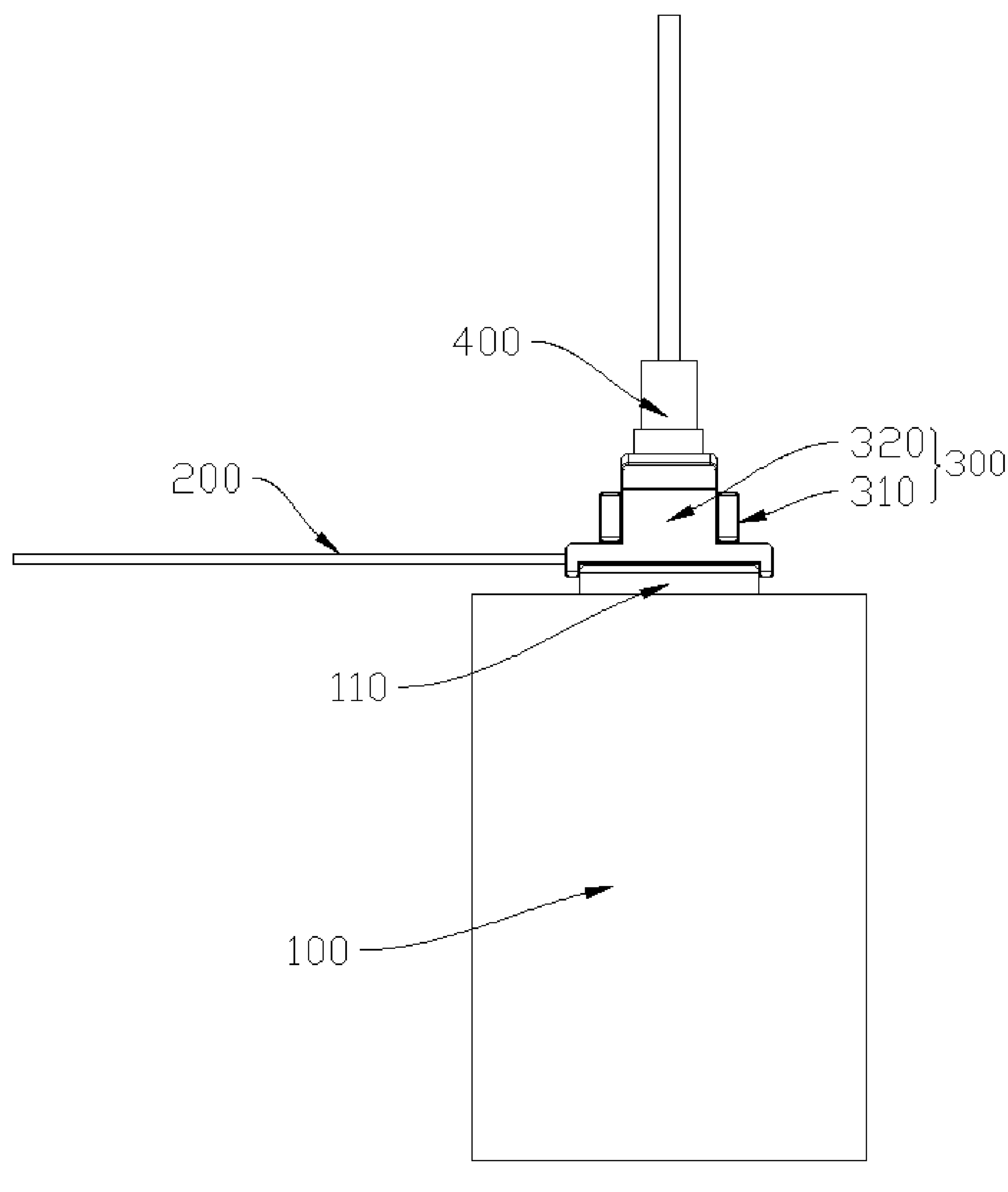
FIG. 2 is a left view of a connection structure of a battery cell for testing according to some embodiments of this application.
Figure 3:
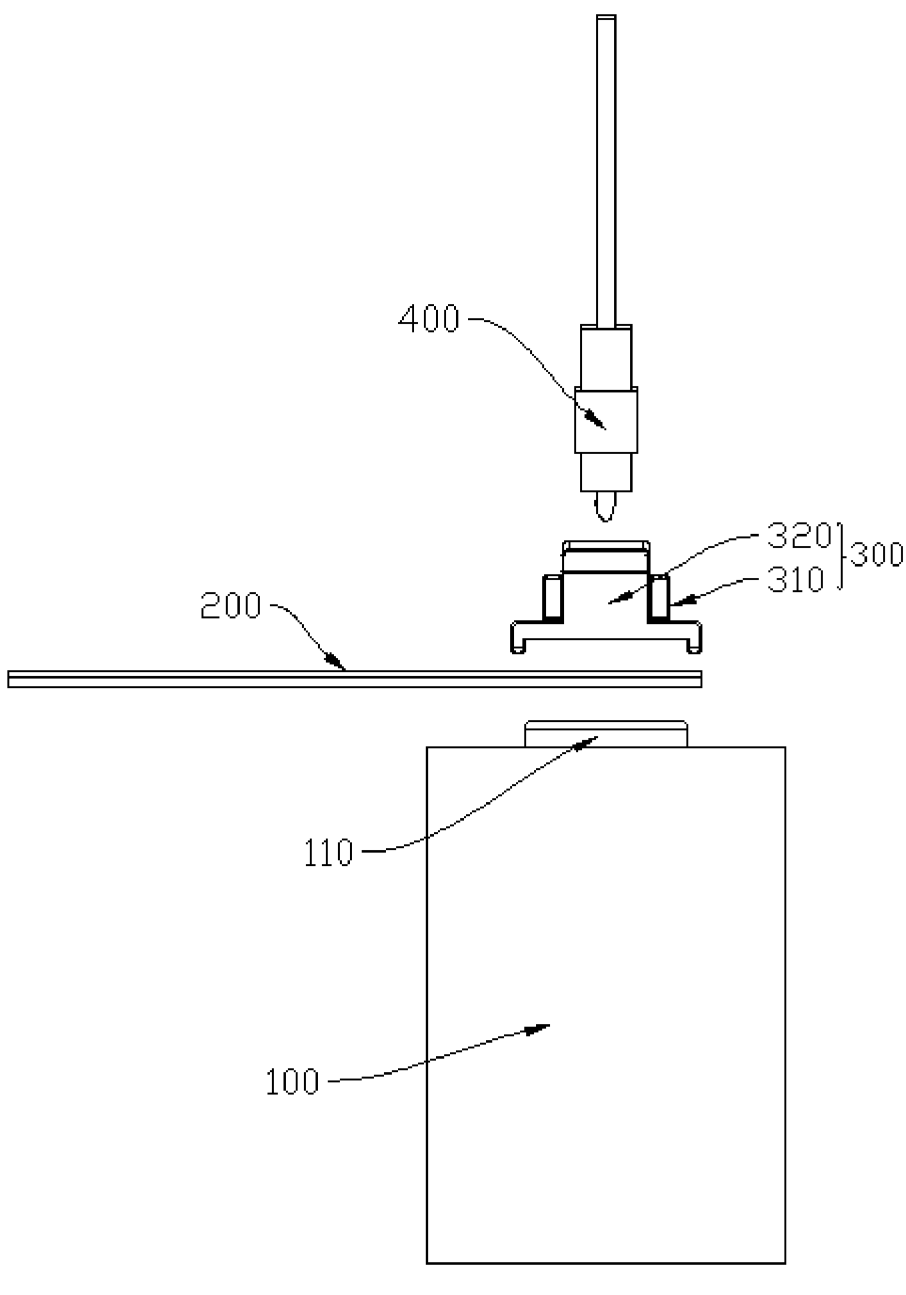
FIG. 3 is an exploded view of a connection structure of a battery cell for testing according to some embodiments of this application.
Figure 4:
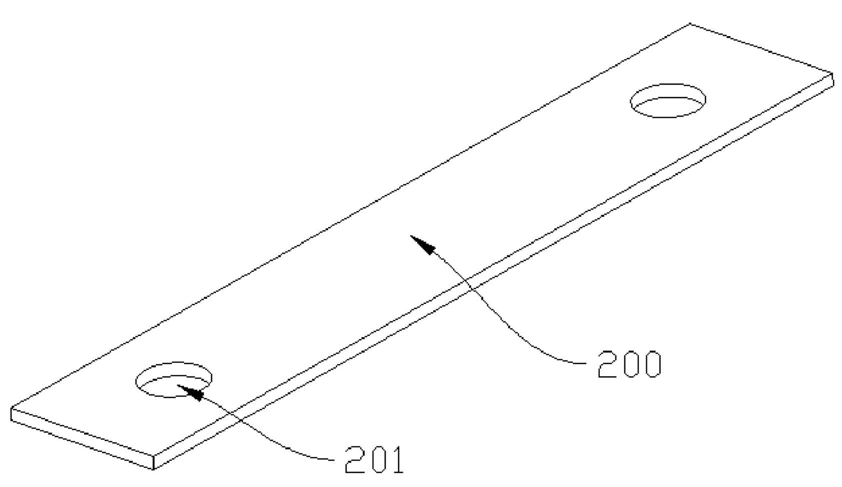
FIG. 4 is a schematic structural diagram of a busbar according to some embodiments of this application.

According to some embodiments of this application, this application further provides a voltage sampling assembly. As shown in FIG. 1 and FIG. 2, the voltage sampling assembly includes the foregoing base 300 and a voltage sampling member 400, where the voltage sampling member 400 is threaded through the through hole 311.

The voltage sampling member 400 is a voltage sampling needle (or an electroprobe, or the like) connected to the electrode terminal 110 to obtain voltage.

According to some embodiments of this application, optionally, as shown in FIG. 9, the through hole 311 is provided with internal threads on the inner wall, and the voltage sampling member 400 is provided with external threads matching the internal threads.

The voltage sampling member 400 passes through the through hole 311 and is fastened in the through hole 311 by threading its external threads with the internal threads of the through hole 311. The body 310 is fastened to the busbar 200 via the clamping member 320, and the through hole 311 faces the electrode terminal 110. This improves the connection stability between the voltage sampling member 400 and the electrode terminal 110.

According to some embodiments of this application, this application further provides a voltage testing apparatus including a processing module and two foregoing voltage sampling assemblies, where voltage sampling members 400 of the two voltage sampling assemblies are all electrically connected to the processing module.

The processing module is a module that calculates the battery capacity according to voltage (V)/load resistance (R)×discharge time (h)=battery capacity (Ah) after the voltage, load resistance, and discharge time of the battery cell 100 are obtained.

During the testing of the battery cell 100, the electrode terminal 110 of the battery cell 100 is connected to a charge/discharge machine via the busbar 200. The current output from the battery cell 100 is transmitted to the charge/discharge machine only through the busbar 200, and the charge/discharge machine controls the current flowing through the busbar 200 to be a stable constant current.

It should be noted that internal resistance of the charge/discharge machine is the load resistance of the battery cell 100.

The voltage sampling assembly is connected to the positive and negative terminals of the battery cell 100 via the voltage sampling member 400 to collect the output voltage of the battery cell 100, and can record the operation duration of the battery. The voltage, operation duration of the battery cell 100, and internal resistance of the charge/discharge machine collected by the voltage sampling assembly are transmitted to the processing module. The processing module processes the data to calculate the battery capacity of the battery cell 100 and obtain the test results of the battery cell 100, so as to determine whether the battery cell 100 is qualified.

According to some embodiments of this application, this application provides a base 300, as shown in FIG. 1 to FIG. 7, including a body, a pair of clamping members 320, and an elastic member 330. The body is provided with a through hole 311 for the voltage sampling member 400 to run through. The pair of clamping members 320 are disposed opposite each other on the body. The clamping members 320 are rotatably disposed on the body. The elastic member 330 is connected between the clamping members 320 and the body 310, so as to provide a clamping force for the clamping member 320 to push the pair of clamping members 320 to get close to and clamp the busbar 200, so that the base 300 is fastened to the busbar 200, facilitating electrical connection between the voltage assembly and the electrode terminal 110. The pair of clamping members 320 can be rotated to move away from the busbar 200 to allow the base 300 to be detached from the busbar 200. The pair of clamping members 320 can be rotated to get close to a new busbar 200 and clamp the new busbar 200, so that the base 300 can be mounted to the new busbar 200 to facilitate battery capacity testing. The base 300 can be reused in battery capacity testing. This can reduce the replacement frequency of the base 300 as compared to the existing battery capacity testing process, reduce the production cost of batteries, improve the cost performance of batteries, and facilitate the promotion of batteries.

Although this application has been described with reference to some preferred embodiments, various modifications to this application and replacements of the components therein with equivalents can be made without departing from the scope of this application. In particular, as long as there is no structural conflict, the various technical features mentioned in the embodiments can be combined in any manner. This application is not limited to the specific embodiments disclosed in this specification but includes all technical solutions falling within the scope of the claims.

What is claimed is:

1. A base for mounting a voltage sampling member configured to sample a voltage of a battery cell, comprising:

a body, provided with a through hole for the voltage sampling member to run through;

a pair of clamping members, mounted to the body for clamping a busbar connected to the battery cell; and an elastic member, connecting the body and the clamping members for providing clamping force.

2. The base according to claim 1, wherein the pair of clamping members are provided on two opposite sides of the body in a first direction, the first direction being perpendicular to an axial direction of the through hole.

3. The base according to claim 1, wherein one clamping member in the pair of clamping members is rotatably mounted to the body around a first axis, and the other one is rotatably mounted to the body around a second axis, the first axis and the second axis being parallel.

4. The base according to claim 3, wherein the first axis and the second axis extend in a second direction, and the second direction is perpendicular to the first direction and is perpendicular to the axial direction of the through hole.

5. The base according to claim 1, wherein the body has a first surface and a second surface opposite each other in the axial direction of the through hole, and the clamping member comprises a clamping end for clamping the busbar and an operating end for manual operation, wherein the clamping end protrudes from the first surface.

6. The base according to claim 5, wherein the clamping end is provided with a snap hook portion for snap hooking on an edge of the busbar.

7. The base according to claim 6, wherein the clamping end is provided with at least two snap hook portions, the at least two snap hook portions are spaced apart in a second direction, the first direction is perpendicular to the axial direction of the through hole, and the second direction is perpendicular to the first direction and perpendicular to the axial direction of the through hole.

8. The base according to claim 5, wherein the operating end protrudes from the second surface.

9. The base according to claim 5, wherein a limiting protrusion is formed around the through hole on the first surface, and the limiting protrusion is configured to be inserted into a positioning hole of the busbar.

10. The base according to claim 1, wherein the body and the clamping members are all made of an insulating material.

11. A voltage sampling assembly, comprising:

the base according to claim 1; and a voltage sampling member, wherein the voltage sampling member is threaded through the through hole.

12. The voltage sampling assembly according to claim 11, wherein the through hole is provided with internal threads on the inner wall, and the voltage sampling member is provided with external threads matching the internal threads.

13. A voltage testing apparatus, comprising:

a processing module; and two voltage sampling assemblies according to claim 11, wherein voltage sampling members of the two voltage sampling assemblies are all electrically connected to the processing module.

* * * * *